(12) United States Patent
Ali et al.

(10) Patent No.: US 10,490,547 B1
(45) Date of Patent: Nov. 26, 2019

(54) IC WITH LARGER AND SMALLER WIDTH CONTACTS

(71) Applicant: Texas Instruments Incorporated, Dallas, TX (US)

(72) Inventors: Abbas Ali, Plano, TX (US); Guruvayurappan Mathur, Plano, TX (US); Poornika Fernandes, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/053,891

(22) Filed: Aug. 3, 2018

(51) Int. Cl.
| | |
|---|---|
| *H01L 27/06* | (2006.01) |
| *H01L 49/02* | (2006.01) |
| *H01L 29/06* | (2006.01) |
| *H01L 27/07* | (2006.01) |

(52) U.S. Cl.
CPC ...... *H01L 27/0629* (2013.01); *H01L 27/0733* (2013.01); *H01L 28/75* (2013.01); *H01L 29/0653* (2013.01)

(58) Field of Classification Search
CPC ................. H01L 27/0629; H01L 27/0733
USPC .......................................... 257/532; 438/381
See application file for complete search history.

(56) References Cited

U.S. PATENT DOCUMENTS

| | | | |
|---|---|---|---|
| 6,177,716 B1 * | 1/2001 | Clark | H01L 27/0805 257/249 |
| 6,211,058 B1 | 4/2001 | Wang et al. | |
| 2005/0212082 A1 * | 9/2005 | Takeda | H01L 28/40 257/534 |
| 2006/0183280 A1 * | 8/2006 | Lee | H01L 21/76807 438/239 |
| 2011/0312152 A1 * | 12/2011 | Kim | H01L 21/31116 438/397 |
| 2015/0348909 A1 * | 12/2015 | Yamazaki | H01L 27/0688 257/775 |
| 2017/0236825 A1 * | 8/2017 | Kim | H01L 23/535 257/532 |

* cited by examiner

*Primary Examiner* — David Vu
*Assistant Examiner* — Brandon C Fox
(74) *Attorney, Agent, or Firm* — Andrew R. Ralston; Charles A. Brill; Frank D. Cimino

(57) ABSTRACT

An integrated circuit (IC) includes a substrate having a semiconductor surface layer, at least one capacitor above the semiconductor surface layer including a bottom plate, a capacitor dielectric over the bottom plate, and a top plate over the capacitor dielectric, functional circuitry in the semiconductor surface layer includes a core region having transistors configured together with the capacitor for realizing at least one circuit function. Electrically conductive metal filled contacts are through the dielectric layer that contact the top plate, the bottom plate, and the core region, including a first filled contact hole having a first depth and a first width that reach the top capacitor plate, and second filled contact hole having a second depth and a second width that reach the core region. The second depth is deeper than the first depth, and the first width is at least ten (10) % larger than the second width.

18 Claims, 10 Drawing Sheets

IC WITH LARGER AND SMALLER WIDTH CONTACTS

FIELD

This Disclosure relates to contacts for integrated circuit (IC) devices that include capacitors formed above a semiconductor surface layer of a substrate.

BACKGROUND

For some advanced analog or digital logic-complementary metal-oxide-semiconductor (CMOS) devices, capacitors can be built using the polysilicon gate level as the bottom plate, with the top plate material layer comprising a diffusion barrier metal such as Ti, TiN, or TaN, that is below the metal stack. Etching contacts through a dielectric layer to reach the top plate and the bottom plate of the capacitor involve different depth contacts, which is generally handled using a single contact mask level.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include a method of fabricating an IC and ICs therefrom including forming a dielectric layer over a capacitor that is over a semiconductor surface layer of a substrate, wherein the capacitor has a bottom plate, a capacitor dielectric over the bottom plate, and a top plate over the capacitor dielectric. A patterned layer is formed over the dielectric layer, the patterned layer having a first opening of a first width and a second opening of a second width, wherein the semiconductor surface layer has functional circuitry for realizing at least one circuit function comprising a core region having a plurality of transistor configured together with at least the capacitor, and wherein the first width is at least ten (10) % larger than the second width. Using the patterned layer, a first contact hole is etched in the dielectric layer at the first opening and a second contact hole is etched in the dielectric layer at the second opening, wherein the first contact hole extends a first depth to the top plate and the second contact hole extends a second depth to the core region, wherein the second depth is deeper than the first depth. The first and the second contact holes are then filled with an electrically conductive fill metal to form a first filled contact and a second filled contact.

BRIEF DESCRIPTION OF THE DRAWINGS

Reference will now be made to the accompanying drawings, which are not necessarily drawn to scale, wherein.

DETAILED DESCRIPTION

Figure 1:
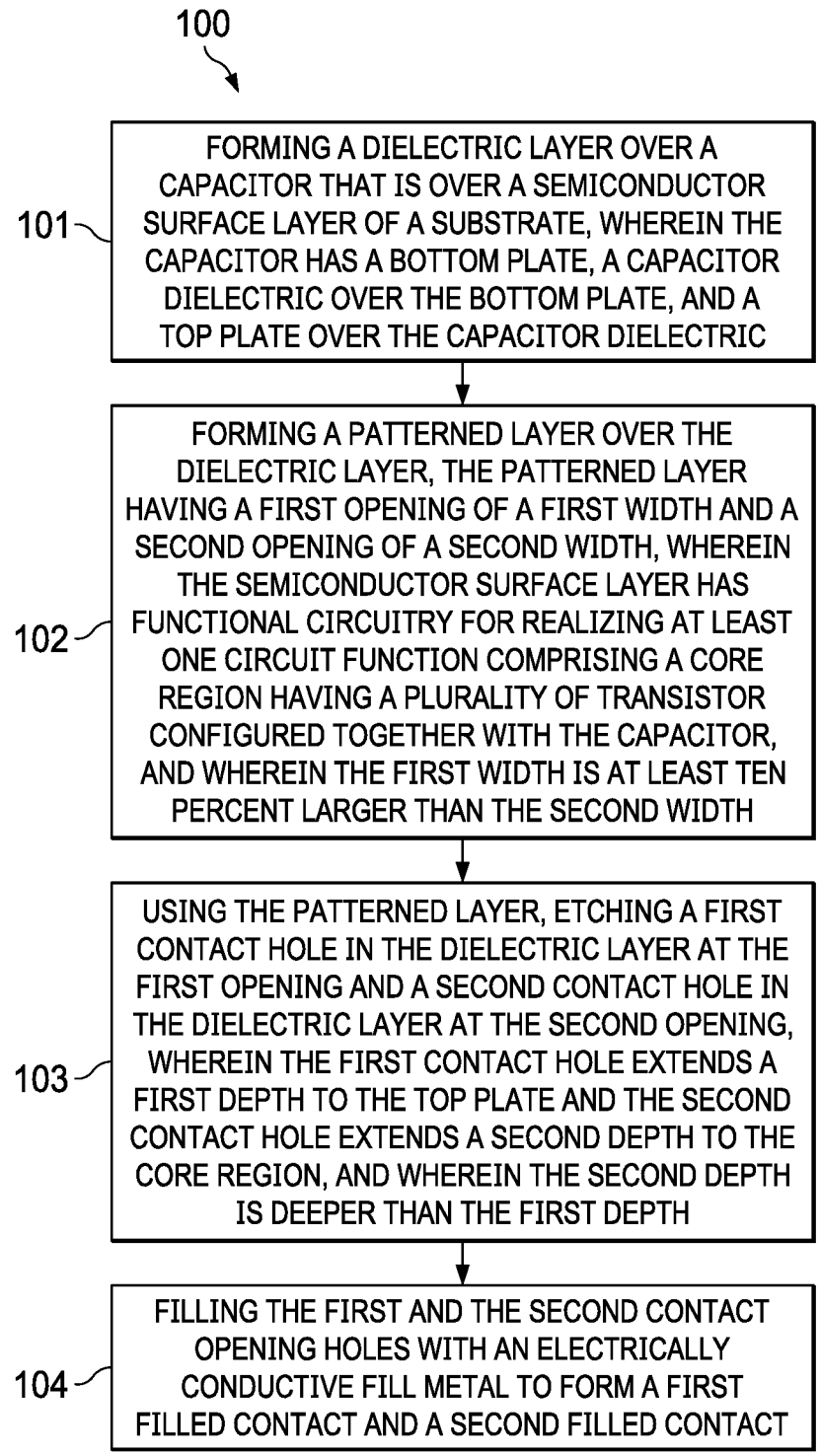
FIG. 1 is a flow chart that shows steps in an example method for forming an IC having different contact widths formed using the same mask level including a shallower contact having a wider width to the top plate of the capacitor as compared to deeper core contacts to the core region that have a narrower width, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects solve the problem of higher and variable contact resistance to the top plate of capacitors formed above the semiconductor surface layer due to problems including a residual thin dielectric layer or residual dielectric particles remaining over the top plate contact after completing the clean after the contact etch process. Such dielectric residuals after the contact etch process results in the contact fill material (e.g., W) having elevated contact resistance to the top plate of the capacitor. This problem is solved by having multiple contact widths at same contact mask level/ time with a shallower and wider contact to the top plate as compared to a deeper and narrower contact to nodes in the core region of the IC. As used herein, core regions include sources, drains, and body contacts in the semiconductor surface layer as well as gates for metal oxide semiconductor (MOS) devices, and base, collector and emitter terminals in the semiconductor surface layer for bipolar devices. It is recognized that because the contact width to the top plate is increased, the aspect ratio of the top plate contact becomes lower, so that the post contact etch cleaning efficiency for the top plate contact improves.

FIG. 1 is a flow chart that shows steps in an example method 100 for forming an IC having different contact widths formed using the same mask level including shallower contacts having a wider width to the top plate of the capacitor as compared to deeper contacts that have a narrower width to nodes in the core region of the IC. The fill material in the contacts generally comprises W, diffusion barrier materials such as TaN, or TiW, or copper. The larger size contact widths to the top plate of the capacitor as evidenced in the Examples below provides better ohmic contact (lower contact resistance) with an improvement being beyond the contact resistance reduction from the larger area contact alone, and a better contact resistance distribution (i.e., less outliers) as well. These benefits are provided without any penalty to other figure of merits (FOMs) for the IC, such as complementary MOS (CMOS) digital density for CMOS ICs, polysilicon to contact spacing rules, and general technology design rules for the core technology.

Step 101 comprises forming a dielectric layer over a capacitor that is over a semiconductor surface layer of a substrate, wherein the capacitor has a bottom plate, a capacitor dielectric over the bottom plate, and a top plate over the capacitor dielectric. Step 102 comprises forming a patterned layer over the dielectric layer, the patterned layer having a first opening of a first width and a second opening of a second width, wherein the semiconductor surface layer has functional circuitry for realizing at least one circuit function comprising a core region having a plurality of transistor configured together with at least the capacitor, and wherein the first width is at least ten (10) % larger than the second width. A contact mask used has the first widths and second widths, and the patterned layer is generally a photoresist layer.

Step 103 comprises using the patterned layer, etching a first contact hole in the dielectric layer at the first opening and a second contact hole in the dielectric layer at the second opening, wherein the first contact hole extends a first depth to the top plate and the second contact hole extends a second depth to the core region, and wherein the second depth is deeper than the first depth. Step 104 comprises filling the first and the second contact holes with an electrically conductive fill metal to form a first filled contact and a second filled contact.

Figure 2A:
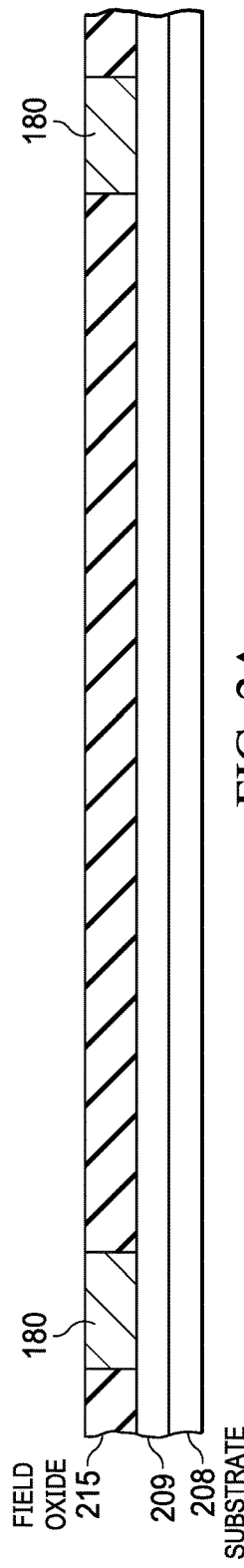
FIGS. 2A-I show successive cross sectional depictions for forming a capacitor on an IC having a polysilicon bottom plate that is on a capacitor dielectric layer over a semiconductor surface layer, where there are different contact widths on the IC including a larger width filled contact to the top plate of the capacitor as compared to the core contacts having a smaller width contact.
Figure 2B:
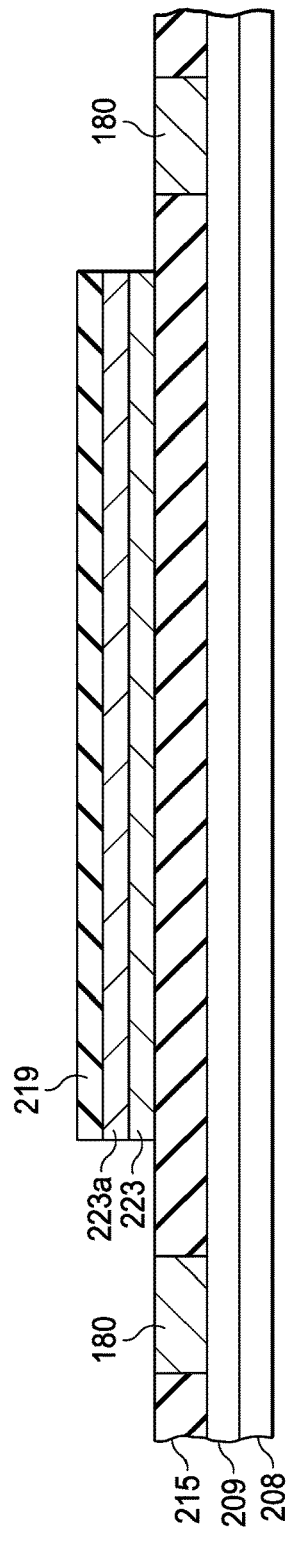
Figure 2C:
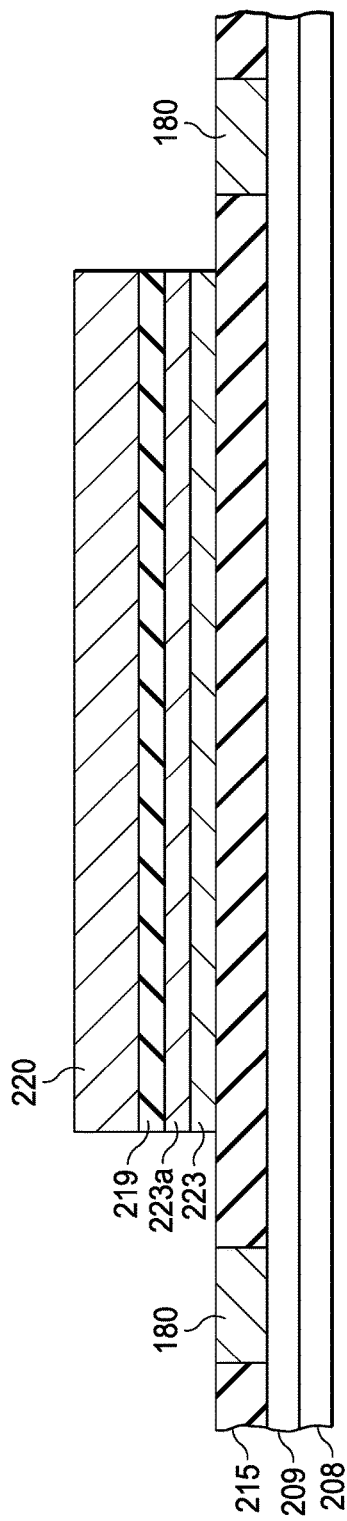
Figure 2D:
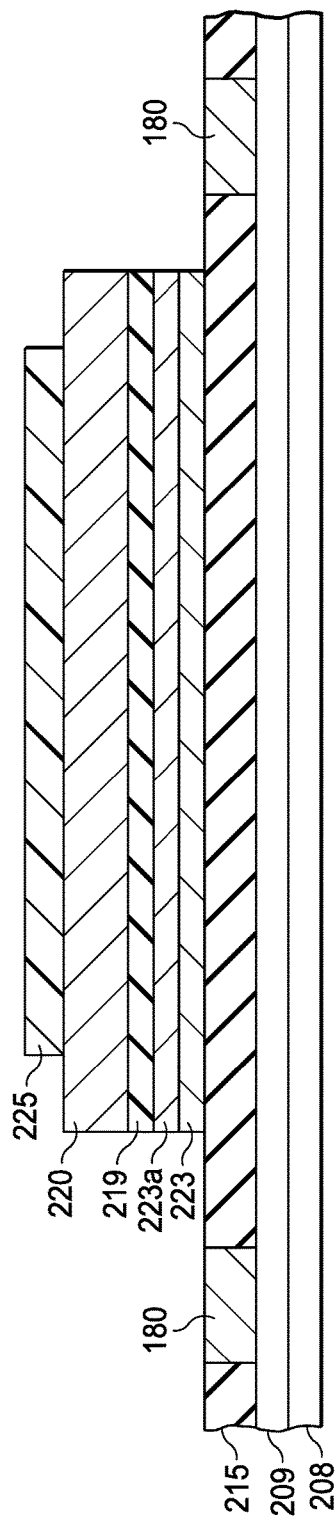
Figure 2E:
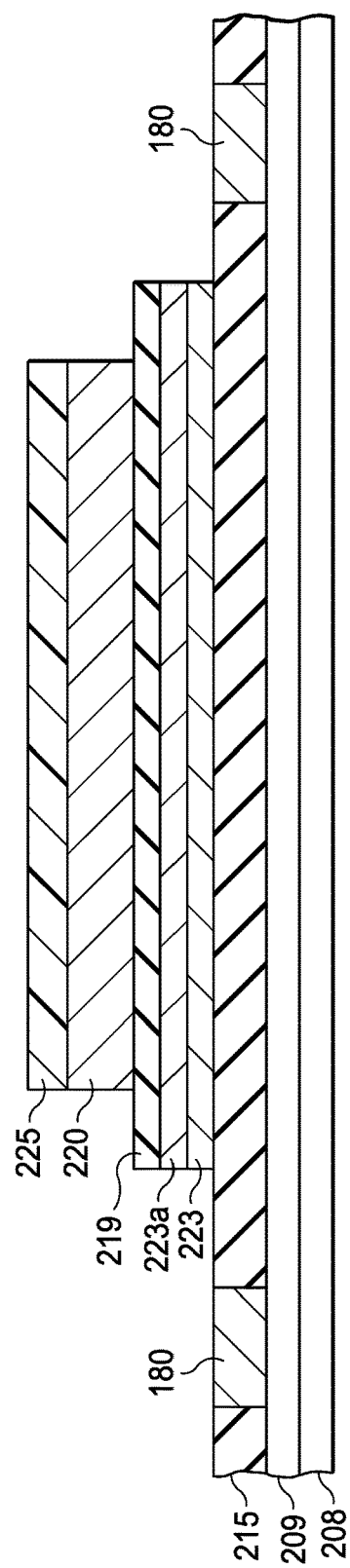
Figure 2F:
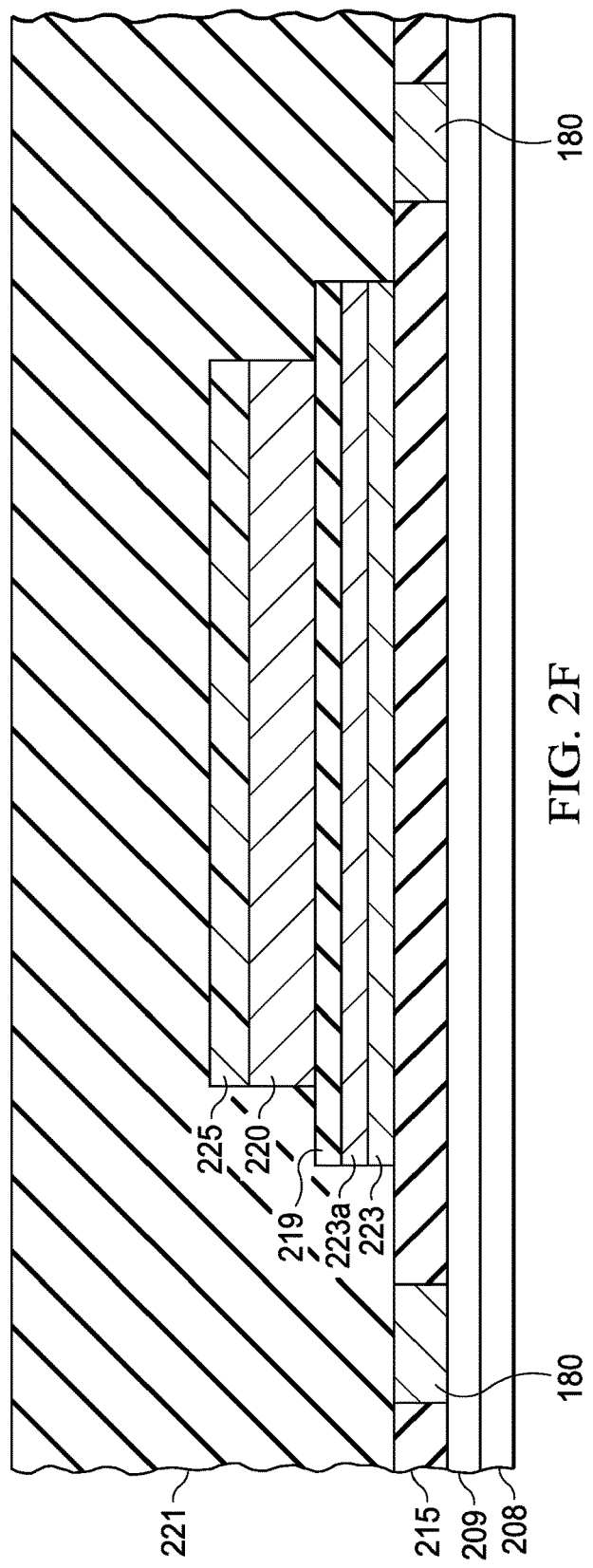
Figure 2G:
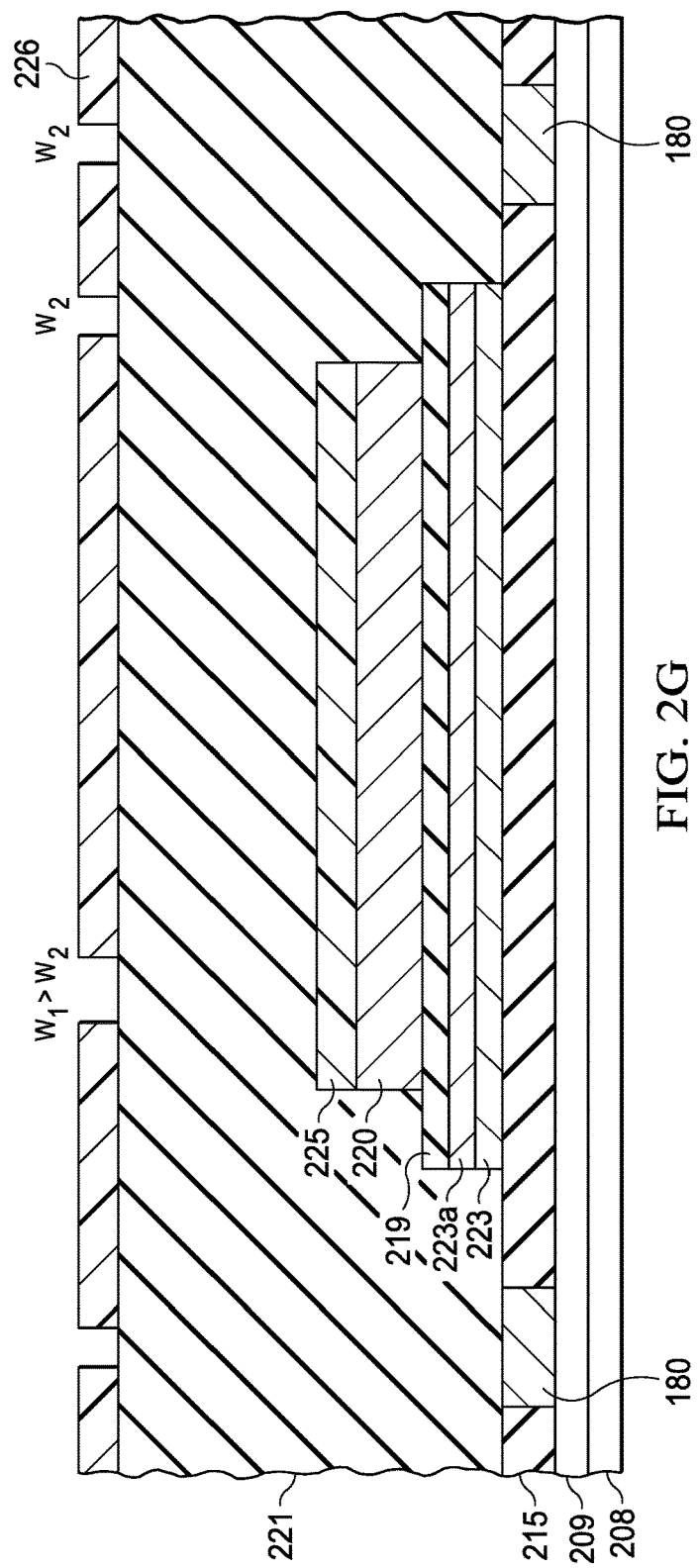
Figure 2H:
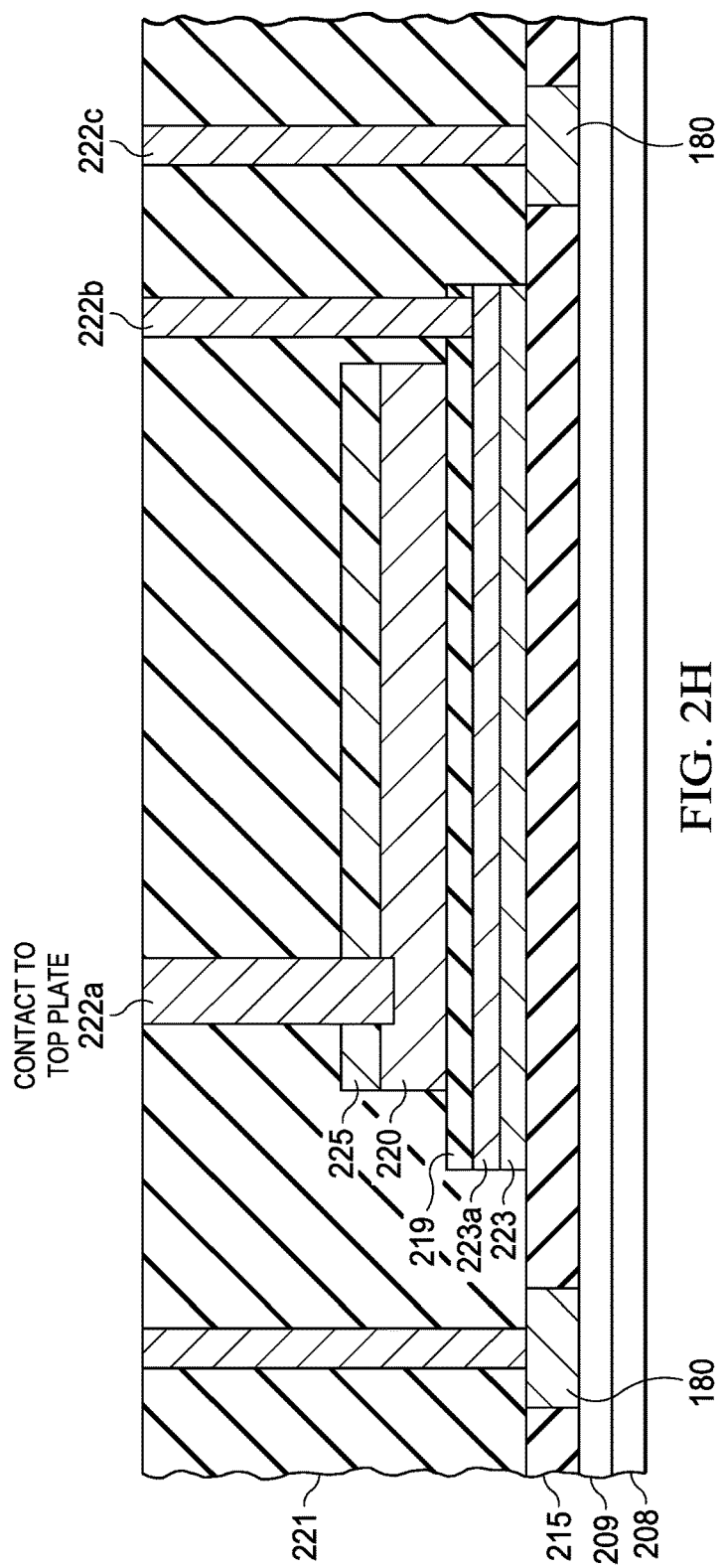
Figure 2I:
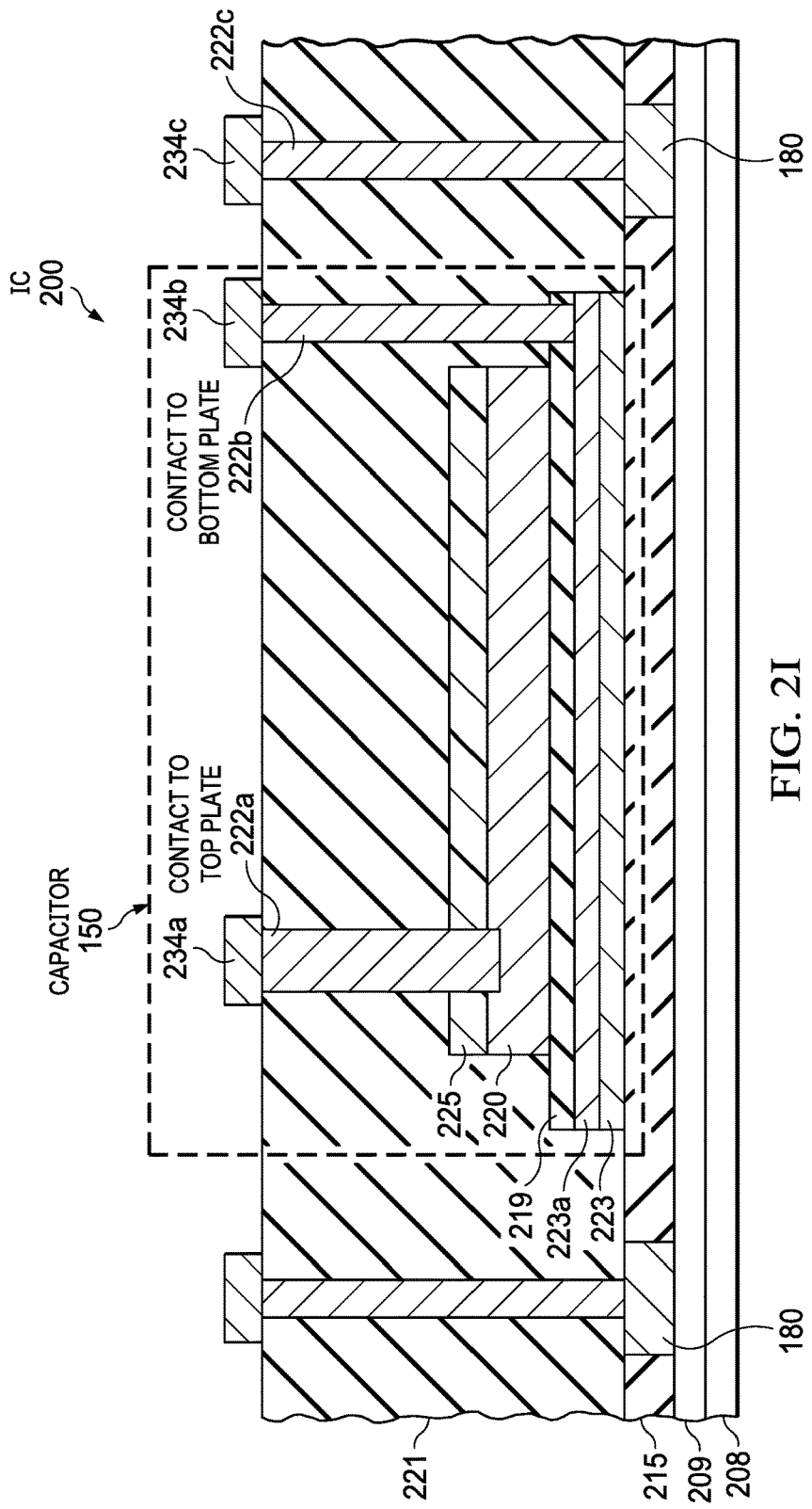

As shown in FIG. 2I described in detail below, the capacitor 150 is above a field oxide layer 215 that is on the semiconductor surface layer 209. The capacitor 150 comprises a top plate 220 on a capacitor dielectric layer 219 on a bottom plate 223, where the first width features shown as first filled contacts 222a are at least ten (10) % larger than the second width features shown as second filled contacts 222c to the core region, and second width features also optionally shown to third filled contact 222b which contact the bottom plate of the capacitor.

FIG. 2A shows a semiconductor surface layer 209 on a substrate 208 including functional circuitry 180 in the core region of the device shown simply as a block, with field oxide 215 being shallow trench isolation (STI) shown in the semiconductor surface layer 209 with its characteristic planarity on a portion of the semiconductor surface layer 209. The functional circuitry 180 comprises circuit elements (including transistors, and generally diodes, resistors, capacitors, etc.) formed in the semiconductor surface layer 209 configured together with the capacitor(s) for realizing at least one circuit function such as analog (e.g., an amplifier, power converter or power field effect transistor (FET)), RF, digital, or a memory function.

FIG. 2B shows the in-process IC shown in FIG. 2A after depositing a polysilicon layer 223, patterning and etching the polysilicon layer 223, forming a silicide layer 223a on the top surface of the polysilicon layer 223 which provides a bottom plate for the capacitor, and depositing a capacitor dielectric 219 on the silicide layer 223a. The total thickness of the capacitor dielectric 219 is generally 200 A to 2,000 A, which can be a single layer or can comprise 2 or more layers. The capacitor dielectric stack can include at least one silicon nitride (SiN) layer. In one particular arrangement the capacitor dielectric 219 comprises a silicon oxide-SiN-silicon oxide stack that may be referred to as an ONO stack.

FIG. 2C shows the in-process IC after depositing a top capacitor plate layer 220 on the capacitor dielectric layer 219. FIG. 2D shows the in-process IC after depositing, patterning and etching a hard mask layer 225 on the top plate 220. The hard mask layer 225 can be deposited using a plasma enhanced chemical vapor deposition (PECVD) process for depositing silicon nitride or silicon oxynitride at a pressure of about 2.5 to 5 torr, at a temperature of about 350° C. The hard mask layer 225 thickness range can be 50 A to 1,500 A.

FIG. 2E shows the in-process IC after etching the top capacitor plate 220 and the capacitor dielectric 219. FIG. 2F shows the in-process IC after depositing and planarizing (e, g., using chemical mechanical polishing (CMP)) a pre-metal dielectric (PMD) layer 221. The PMD layer 221 can comprise a tetraethoxysilane (TEOS)-derived silicon oxide layer. A TEOS deposition for a non-plasma deposition process can comprise low pressure CVD (LPCVD) at a pressure of about 200 to 400 mTorr and at a temperature of about 700° C. However, other dielectric layers can also be used for the PMD layer 221 including deposited silicon oxides, such as comprising an organosilicate glass (OSG), a low-k dielectric (i.e., a smaller dielectric constant relative to silicon dioxide), a doped dielectric layer such as a phosphorus doped silicate glass (PSG), a fluorine-doped silica glass (FSG), high density plasma oxide (HDP), or a SiN layer or its variants (e.g., SiON). The thickness range for the PMD layer 221 is generally 6,000 A to 8,000 A.

FIG. 2G shows the in-process IC after forming a patterned layer 226 (such as a photoresist (PR) pattern) over the PMD layer 221 using a contact mask having a first width to form larger first width openings shown as $W_1$ and a second width to form smaller second width openings shown as $W_2$, including $W_2$ openings over the functional circuitry 180 in the core region, and over the silicide layer 223a extending beyond the top capacitor plate 220 to provide contact to the bottom plate of the capacitor provided by the polysilicon layer 223. This in-process IC corresponds to the structure after step 102 in method 100. As described above, the $W_1$ openings have a width that is at least 10% larger than the $W_2$ openings, such as at least 20% larger, or at least 30% larger.

FIG. 2H shows the in-process IC after etching contact holes in the PMD layer 221 using the pattern from the patterned layer 226 corresponding to step 103, and filling the contact holes with an electrically conductive filler material metal such as W, TiN, TaN or Cu corresponding to step 103. Following step 104 as shown in FIG. 2H there are provided a first filled contact 222a to the top plate 220, a third filled contact 222b to the contact to the silicide layer 223a extending beyond the top capacitor plate 220 to contact the bottom plate of the capacitor, and a second filled contact 222c in the core region to the contact the nodes of the functional circuitry 180, typically to contact MOSFET sources, drains, and body regions.

FIG. 2I shows the in-process IC shown as IC 200 after depositing, patterning, and then etching an interconnect metal layer to form metal interconnects 234a, 234b, and 234c on the PMD layer 221 over the filled contacts 222a, 222b, and 222c, respectively. IC 200 features different contact widths including a larger contact width shown as first filled contacts 222a to the top plate 220 of the capacitor 150 as compared to the second filled core contacts shown as 222c and optionally the third filled contacts 222b to the bottom plate both having the smaller contact width. The metal interconnects can comprise AlCu, typically with 0.5 to 4 wt. % Cu. Alternatively, the metal interconnect layer can comprise only copper in which case a damascene process is generally performed (a damascene process is not shown in FIGS. 2A-2I).

The wafer processing can then be completed by conventional back end of the line (BEOL) processing comprising forming one or more additional metal levels thereon including a top metal level. The top metal layer can comprise aluminum (or an aluminum alloy) or copper. Passivation overcoat (PO) then generally follows, followed by patterning the PO to expose the bond pads. The PO layer comprises at least one dielectric layer such as silicon oxide, SiN, or SiON.

EXAMPLES

Disclosed aspects are further illustrated by the following specific Examples, which should not be construed as limiting the scope or content of this Disclosure in any way.

Figure 3A:
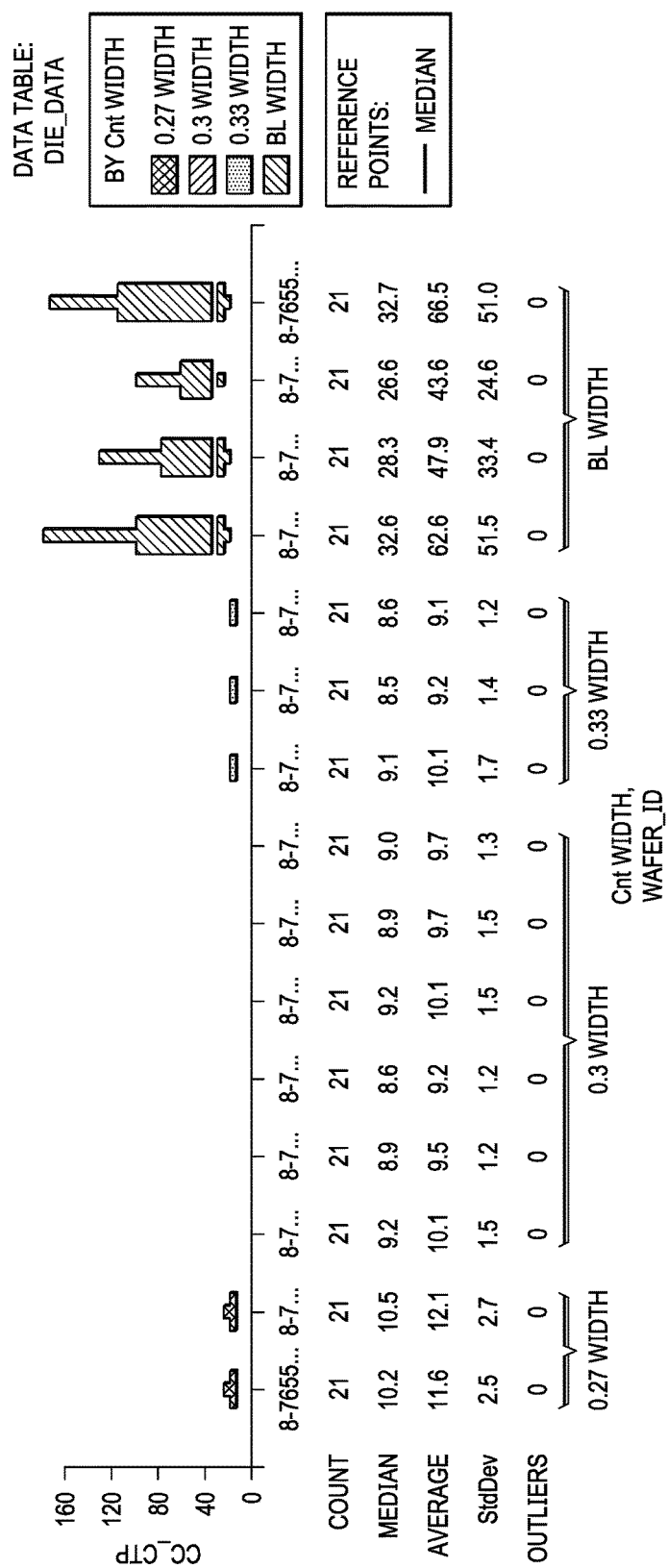
FIGS. 3A and 3B show measured contact resistance data from Kelvin isolated resistors for a contact chain and single contacts, respectively.
Figure 3B:
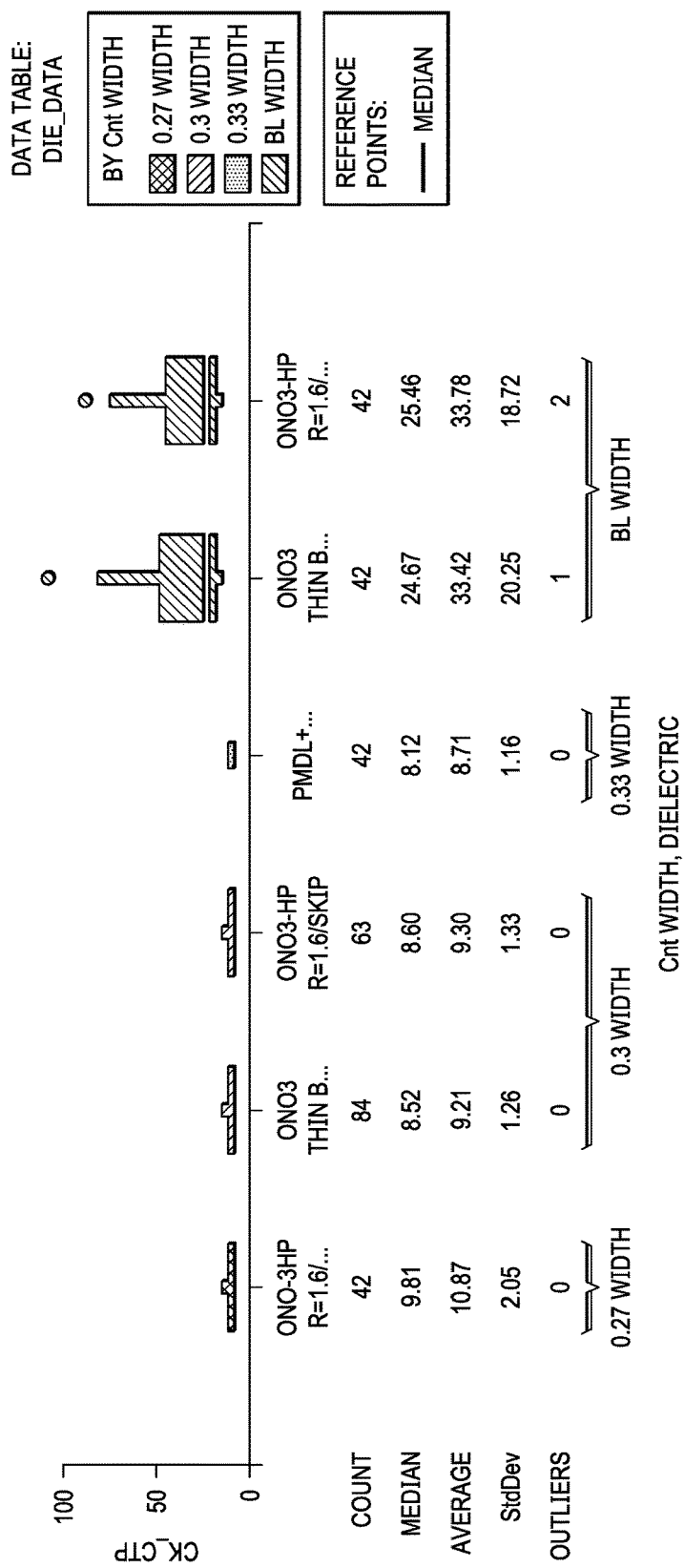

FIGS. 3A and 3B show measured contact resistance data at room temperature from Kelvin isolated resistors for a contact chain and single contacts, respectively. The data shown evidences a significantly lower average contact resistance is obtained that is less than the reduced contact resistance value calculated taking into consideration the increased contact area, and a significant reduction in the standard deviation of the contact resistance, as well as the elimination of contact resistance outliers for a larger contact width to the top plate of a capacitor having a polysilicon bottom plate, as compared to a baseline (shown as BL) smaller contact width for the top plate of the otherwise same capacitor structure.

Disclosed aspects can be used to form IC die that may be integrated into a variety of assembly flows to form a variety of different devices and related products. The IC die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the IC die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. A method of fabricating an integrated circuit (IC), comprising:
   forming a dielectric layer over a capacitor that is over a semiconductor surface layer of a substrate, wherein the capacitor has a bottom plate, a capacitor dielectric over the bottom plate, and a top plate over the capacitor dielectric;
   forming a patterned layer over the dielectric layer, the patterned layer having a first opening of a first width and second and third openings of a second width, wherein the semiconductor surface layer has functional circuitry for realizing at least one circuit function comprising a core region having a plurality of transistors configured together with at least the capacitor, and wherein the first width is at least ten (10) % larger than the second width;
   using the patterned layer, etching a first contact hole in the dielectric layer at the first opening and second and third contact holes in the dielectric layer at the respective second and third openings, wherein the first contact hole extends a first depth to the top plate, the second contact hole extends a second depth to the core region, and the third contact hole extends to the bottom plate, wherein the second depth is deeper than the first depth, and
   filling the first, second and third contact holes with an electrically conductive fill metal to form a first filled contact, a second filled contact and a third filled contact.

2. The method of claim 1, wherein the top plate comprises TiN, Ti, or TaN.

3. The method of claim 1, wherein the functional circuitry comprises a Complementary Metal-Oxide Semiconductor (CMOS) transistor.

4. The method of claim 1, wherein the bottom plate comprises doped polysilicon.

5. The method of claim 4, wherein the bottom plate comprises a silicide on the doped polysilicon.

6. The method of claim 1, wherein the first width is at least (≥) 20% larger than the second width.

7. The method of claim 1, wherein the capacitor dielectric comprises a dielectric stack comprising a silicon oxide layer and a silicon nitride or a silicon oxynitride layer.

8. The method of claim 1, further comprising after the filling removing overburden regions of the electrically conductive fill metal using CMP.

9. An integrated circuit (IC), comprising:
   a substrate having a semiconductor surface layer;
   at least one capacitor above the semiconductor surface layer comprising a bottom plate, a capacitor dielectric over the bottom plate, and a top plate over the capacitor dielectric;
   functional circuitry in the semiconductor surface layer comprising a core region having a plurality of transistors configured together with the capacitor for realizing at least one circuit function, and
   electrically conductive metal filled contacts through the dielectric layer that contact the top plate, the bottom plate, and the core region, including a first filled contact hole having a first depth and a first width that reaches the top capacitor plate, a second filled contact hole having a second depth and a second width that reaches the core region, and a third filled contact hole that contacts the bottom plate having the second width,
   wherein the second depth is deeper than the first depth, and wherein the first width is at least ten (10) % larger than the second width.

10. The IC of claim 9, wherein the top plate comprises TiN, Ti, or TaN.

11. The IC of claim 9, wherein the functional circuitry comprises a Complementary Metal-Oxide Semiconductor (CMOS) transistor.

12. The IC of claim 9, wherein the bottom plate comprises doped polysilicon.

13. The IC of claim 12, wherein the bottom plate comprises a silicide layer on the doped polysilicon.

14. The IC of claim 9, wherein the first width is at least (≥) 20% larger than the second width.

15. The IC of claim 9, wherein a thickness of the capacitor dielectric is 20 nm to 200 nm.

16. The IC of claim 9, wherein the capacitor dielectric comprises a dielectric stack comprising a silicon oxide layer and a silicon nitride or a silicon oxynitride layer.

17. The IC of claim 9, wherein the capacitor is formed on field oxide that is on the semiconductor surface layer.

18. The IC of claim 17, wherein the field oxide comprises shallow trench isolation (STI).

* * * * *